United States Patent [19]

Yoshida

[11] Patent Number: 5,657,275

[45] Date of Patent: Aug. 12, 1997

[54] SEMICONDUCTOR MEMORY DEVICE INCLUDING SENSE AMPLIFIER FOR HIGH-SPEED WRITE OPERATION

[75] Inventor: Makoto Yoshida, Nara, Japan

[73] Assignee: Sharp Kabushiki Kaisha, Osaka, Japan

[21] Appl. No.: 19,557

[22] Filed: Feb. 19, 1993

[30] Foreign Application Priority Data

Feb. 21, 1992 [JP] Japan .................................. 4-035205

[51] Int. Cl.[6] .................................................. G11C 11/34
[52] U.S. Cl. .................... 365/189.05; 365/190; 365/205; 365/233.5
[58] Field of Search ............................. 365/189.05, 190, 365/205, 233.5

[56] References Cited

U.S. PATENT DOCUMENTS

| | | |
|---|---|---|
| 4,421,996 | 12/1983 | Chuang et al. ....................... 365/205 |
| 4,480,321 | 10/1984 | Aoyama ................................. 365/233.5 |
| 5,062,082 | 10/1991 | Choi ....................................... 365/233.5 |
| 5,089,726 | 2/1992 | Chappell et al. ....................... 365/205 |
| 5,245,573 | 9/1993 | Nakaoka ............................... 365/189.05 |
| 5,258,950 | 11/1993 | Murashima et al. .................. 365/189.05 |

*Primary Examiner*—David C. Nelms
*Assistant Examiner*—F. Niranjan
*Attorney, Agent, or Firm*—Morrison & Foerster LLP

[57] ABSTRACT

A semiconductor memory device includes a memory cell array with each cell being connected to respective pairs of complementary bit lines, and a write circuit for writing data to the memory cells by applying complementary write signals to the complementary bit lines. The write circuit includes complementary data lines, a buffer circuit for applying complementary data signals to the data lines in response to the input data, and sense amplifier connected to the data lines and the bit lines for amplifying the data lines differential signals and for producing the complementary write signals.

11 Claims, 4 Drawing Sheets

SEMICONDUCTOR MEMORY DEVICE INCLUDING SENSE AMPLIFIER FOR HIGH-SPEED WRITE OPERATION

BACKGROUND OF THE INVENTION

1. Field of the Invention:

The present invention relates to a semiconductor memory device capable of writing data to memory cells, such as a static random access memory (SRAM) and a dynamic random access memory (DRAM).

2. Description of the Related Art:

As shown in FIG. 5, in a semiconductor memory device capable of writing data to memory cells, such as an SRAM and a DRAM, write data is input from a data input pad 21 connected to a data input buffer 22. In this semiconductor memory device, the data input buffer 22 is constituted by an inverter circuit. In a logic gate such as an inverter circuit, an input threshold level has a noise margin with respect to an output level. Therefore, when data at an H level or an L level is input, the input data can be output at an L level or an H level, respectively (even though these H level and L level are close to each other to some extent). Thus, the data input buffer 22 is used for restoring the input data, which was deteriorated while being transmitted through a bus line or the like, to output data at an H level or an L level.

The restored input data which is set to the appropriate output level by the data input buffer 22 is transmitted through a single data line 23 to a group of memory cells 24. The data line 23 is provided on a semiconductor chip over a long length, so that the data is also deteriorated while being transmitted through the data line 23. In order to overcome this problem, associated with the group of memory cells 24, a logic gate 25 (shown as an inverter circuit in the figure) is connected to an end of the data line 23, whereby the data deteriorated while being transmitted through the data line 23 is restored to an H level or an L level again. The output data from the logic gate 25 is also inverted by an inverter circuit 26 and the outputs of logic gates 25 and 26 are transmitted to a column transfer gate 27.

The column transfer gate 27 operates as follows:

A pair of bit lines 28 are selected from a number of pair of bit lines in a memory cell array by a column decoder (not shown). One bit line $\overline{B}$ of the selected pair of bit lines 28 is connected to the output of the logic gate 25, and the other bit line B of the selected pair of bit lines 28 is connected to the output of the inverter circuit 26. On the basis of data on the data line 23, data at an H level and an L level which have a complementary relationship with each other are produced through the logic gate 25 and the inverter circuit 26 and transmitted to the bit lines 28. The transmitted data is written in a memory cell 29 selected by a row decoder (not shown).

In recent years, with each advance to the next IC memory generation, a great increase in memory capacity in a semiconductor memory device is realized by decreasing the area of a memory cell as well as increasing the area of a chip. Thus, the length of the data line 23 extending from the data input buffer 22 to the array of memory cells 24 in FIG. 5 is much more increased along with the increase in the area of the chip, resulting in an increase in distributed capacitance of the data line 23.

Because of this increase in distributed capacitance, in a conventional semiconductor memory device, the signal transition time is remarkably delayed along with the increase in the distributed capacitance of the data line 23, causing a further problem of decreasing access speed.

Some semiconductor memory devices in recent years have the data line 23 with a length of about 20 mm. Suppose, for example, that the distributed capacitance per unit length of the data line 23 is 0.5 pF/mm, the distributed capacitance for full length becomes 10 pF (=20 mm×0.5 pF/mm). In this example, voltage V, capacitance C, and charge Q have the following relationship:

$$V = \frac{1}{C} Q \qquad (I)$$

The charge Q, an instantaneous current i, and time t have the following relationship:

$$Q = \int i \, dt \qquad (II)$$

If the charge Q is eliminated from Equations I and II, the following relationship is obtained.

$$V = \frac{1}{C} \int i \, dt \qquad (III)$$

Moreover, suppose that the instantaneous current i is a constant current I, so that the integration term in Equation III can be represented by the product of the current I and the time t. Thus, the following relationship can be obtained.

$$t = \frac{CV}{I} \quad \left( V = \frac{1}{C} It \right) \qquad (IV)$$

Thus, if the data line 23 is charged by using a transistor with a driving capacity of 3 mA until the voltage level thereof is increased from a GND level to 70% of a $V_{cc}$ level, where $V_{cc}$ is 5 V:

$$t = \frac{10 \times 10^{-12} \times 5 \times 0.7}{3 \times 10^{-3}} \approx 11.7 \, nS \qquad (V)$$

As shown in Equation V, it takes about 11.7 nano sec. to charge the data line 23 in a conventional device.

Because of this, in the case of the semiconductor device shown in FIG. 5, as shown in FIG. 6, for example, at time $t_{11}$, input data $S_{21}$ of the data input pad 21 is switched from an H level to an L level. When the data input buffer 22 outputs an H level, an electrical potential $S_{22}$ at the end of the data line 23 is gradually increased from the GND level to the $V_{cc}$ level. At $t_{12}$ which is 11.7 nano sec. ahead of $t_{11}$, when the electrical potential $S_{22}$ reaches 70% of the $V_{cc}$ level, an output $S_{23}$ of the logic gate 25 is gradually switched to an L level and an output $S_{24}$ of the inverter circuit 26 is switched to an H level. Then the bit lines B and $\overline{B}$ of the pair of bit lines 28 are discharged and charged via the column transfer gate 27.

As a result, in a conventional semiconductor memory device, it is necessary that the electrical potential $S_{22}$ at the end of the data line 23 is increased up to the $V_{cc}$ level and decreased to the GND level (i.e., the electrical potential $S_{22}$ should fully swing between the $V_{cc}$ level and the GND level). There further arises the problem in that access speed is decreased due to the delay of the charging and discharging time caused by the distributed capacitance of the data line.

SUMMARY OF THE INVENTION

The semiconductor memory device of the present invention, includes: a memory cells section; an input portion for receiving input data to be stored in the memory cells section; a buffer means connected to the input portion and having a first output and a second output, the buffer means, in response to the data, producing high level electrical potential at one of the first output and the second output and complementarily producing low level electrical potential at the other of the second output or the first output; a sense amplifier having a first input and a second input, the sense amplifier comparing the two input electrical potentials; the sense amplifier further having a first output and a second output which are respectively connected to corresponding bit line pairs; the sense amplifier, in response to the result of comparison of the two input electrical potentials, producing high level electrical potential at one of the first output and the second output and complementarily producing low level electrical potential at the other of the second output or the first output; a first line for connecting the first output of the buffer means to the first input of the sense amplifier; and a second line for connecting the second output of the buffer means to the second input of the sense amplifier.

In an embodiment, the device further comprises: detection means for detecting a transitional change in level of the input data and producing a detection signal at an output of the detection means in response to the transitional change in level of the input data; and switch means connected to the detection means for electrically connecting the first line to the second line for a short period in response to the detection signal, thereby pre-charging the first and second lines to be at substantially the same electrical potential level.

In response to the input data, the data input buffer is capable of producing complementary output data at an H level and an L level to two data lines, respectively. For example, in the case where the input data is an H level, the data input buffer outputs the data at an H level to one data line and at an L level to the other data line, respectively. In the case where the input data is an L level, the data input buffer outputs the data at an L level to one data line and at an H level to the other data line, respectively.

The sense amplifier compares the electrical potentials at the ends of the data lines and sets a pair of complementary bit lines in the memory cell array to an H level and an L level, respectively (i.e., one of the pair of bit lines is set to an H level and the other one of the pair of bit lines is set to an L level). More specifically, when the electrical potential at the end of one data line becomes higher than that of the other data line, an H level is output to one bit line and an L level is output to the other complementary bit line. In contrast, when the electrical potential at the end of the other data line becomes higher than that of the one data line, an L level is output to one bit line and an H level is output to the other bit line.

Thus, a charge current is supplied to the data line for which the output of the data input buffer is switched from an L level to an H level due to a change of the signal level of the input data. Then, the distributed capacitance of the data line starts being charged. Along with the charging of the distributed capacitance of the data line, the electrical potential at the end of the data line on the side of the group of memory cells is gradually increased. Moreover, a discharge current flows out of the other data line for which the output of the data input buffer is switched from an H level to an L level, and the distributed capacitance of that other data line starts being discharged. Along with the discharging of the distributed capacitance of the data line, the electrical potential at the end of the data line on the side of the group of memory cells is gradually decreased.

When the electrical potentials at the ends of the data lines reverse due to the increase in one data line electrical potential and the decrease in the other data line electrical potential, the output of the sense amplifier is inverted to output signal level to the pair of bit lines (here, the signal level output to one bit line is reverse to that output to the other bit line).

According to the present invention, the output level can be determined by the sense amplifier simply by charging and discharging the data lines until the electrical potentials at the ends thereof reverse, without fully swinging the electrical potentials of the data lines between the $V_{cc}$ level and the GND level. Therefore, the signal transition time on the data lines can be shortened.

According to another aspect of the present invention, when the signal level of the input data is changed, an input transition detection circuit produces a detection signal for a predetermined period of time, during which two complementary data lines are short-circuited or connected together by a switching circuit. The electrical potentials of the data lines, whose H level and L level are determined as a result of sufficient charging and discharging of the data lines, rapidly come close to each other and become nearly the same potential, at least, in the vicinity of the switching circuit. When the switching circuit disconnects the data lines, and an H level and an L level are output from the data input buffer, the electrical potentials at the ends of the data lines are reversed faster than the above-mentioned structure. Consequently the output of the sense amplifier is even more rapidly reversed.

According to this aspect of the present invention, before the data lines are charged and discharged by the data input buffer, the electrical potentials at these data lines can be equalized by short-circuiting these data lines together. Thus, the signal transition or separation time between the data lines can be further shortened.

If an H level output from the data input buffer is produced at a voltage lower than the power source voltage level, charge and discharge current of the data lines can be decreased, the signal transition time on the data lines is further shortened, and electric power dissipation can be reduced.

Thus, the invention described herein makes possible an advantage of providing a semiconductor memory device in which a signal level is determined by a slight change of an electrical potential and signal transition times on data lines are shortened by enabling a sense amplifier to receive an output from a data input buffer via two complementary data lines.

These and other advantages of the present invention will become apparent to those skilled in the art upon reading and understanding the following detailed description with reference to the accompanying figures.

DESCRIPTION OF THE PREFERRED EMBODIMENTS

Figure 1:
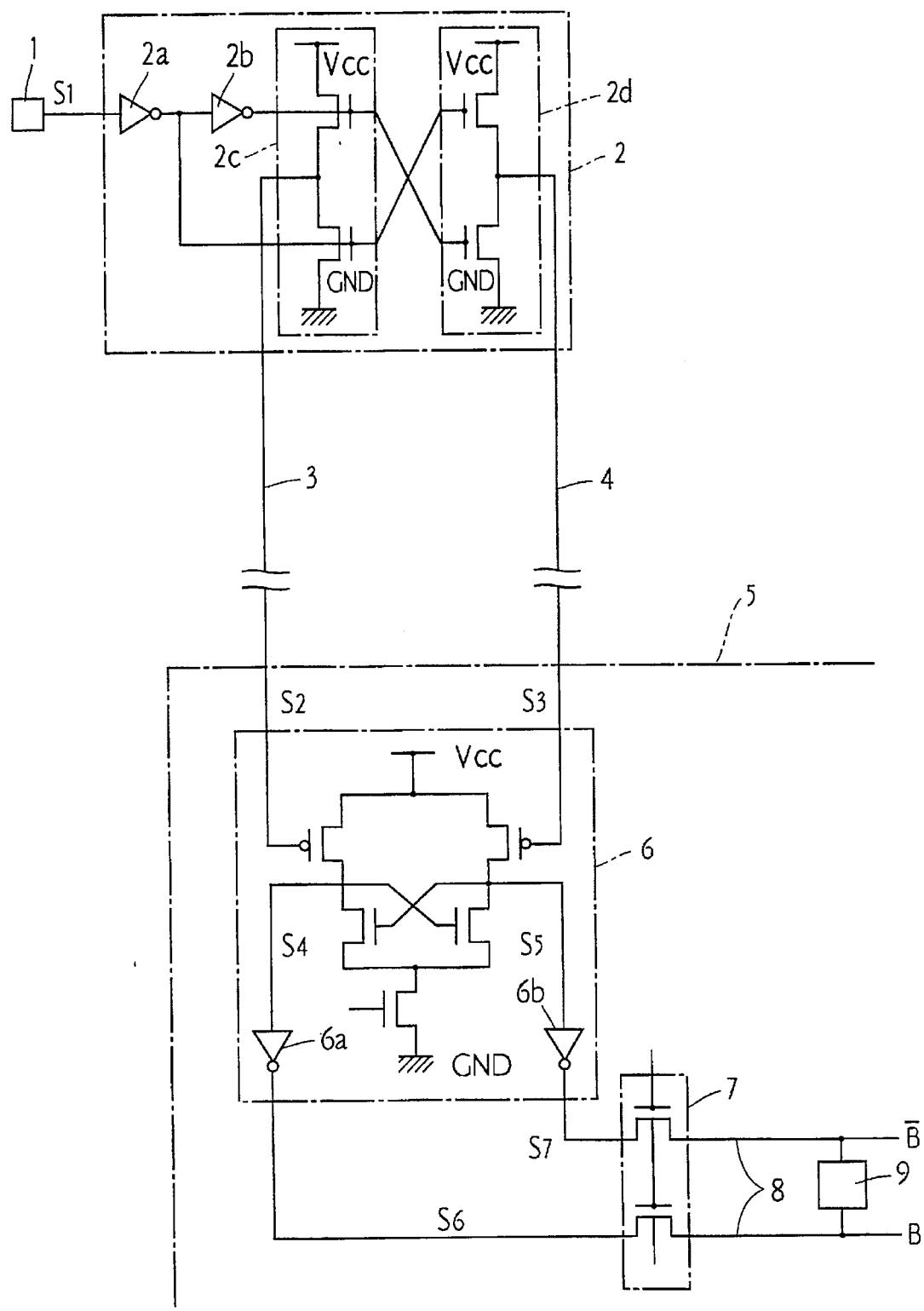
FIG. 1 is a simplified schematic diagram of an example of a data write section in a semiconductor memory device according to the present invention.

The present invention will be described by way of illustrating examples with reference to the drawings.

EXAMPLE 1

First of all, the structure of a circuit of a data write section in an SRAM or a DRAM will be described.

Data which is to be written to and stored in an SRAM or a DRAM (hereinafter "write data") is transmitted to a data input pad 1 formed on a semiconductor chip through a bus line or the like, and the write data is inputted to a data input buffer 2 connected to the input pad 1. The write data typically has binary states (logic 1 and logic 2 or H and L levels).

The data input buffer 2 includes a first inverter circuit 2a and a second inverter circuit 2b; and a first output circuit 2c and a second output circuit 2d. The first inverter circuit 2a inverts the logic state of the write data applied to the data input pad 1. The second inverter circuit 2b further inverts the write data output from the first inverter circuit 2a. Thus, the first and second inverter circuits 2a and 2b reproduce or restore the write data, which is deteriorated while being transmitted through the bus line or the like, at an H level or an L level. Both of the output circuits 2c and 2d are constituted by totem-pole output circuits each including two N-channel MOSFETs. These circuits function as a buffer circuit for applying the write data output from the inverter circuits 2a and 2b to two complementary data lines 3 and 4. Namely, in the case when the second inverter circuit 2b outputs the write data at an H level, a MOSFET connected to a power source $V_{cc}$ of the first output circuit 2c turns on and the first output circuit 2c outputs the write data at an H level to the data line 3. In contrast, when the first inverter circuit 2a outputs the write data at an H level, a MOSFET connected to a ground GND or reference of the first output circuit 2c turns on and the first output circuit 2c outputs the write data at an L level to the data line 3. When the first inverter circuit 2a outputs the write data at an H level, a MOSFET connected to the power source $V_{cc}$ of the second output circuit 2d turns on and the second output circuit 2d outputs the write data at an H level to the data line 4. In contrast, when the second inverter circuit 2b outputs the write data at an H level, a MOSFET connected to the ground GND of the second output circuit 2d turns on and the second output circuit 2d outputs the write data at an L level to the data line 4. Thus, the two output circuits 2c and 2d complementarily set the write data to an H level or an L level to the complementary data lines in accordance with input write data. In this example, the output circuits 2c and 2d employ N-channel MOSFETs, so that an H level output is decreased by a threshold voltage $V_{th}$ and a voltage $\alpha$ (amount varied due to back bias effects), compared with the $V_{cc}$ level.

The complementary data lines 3 and 4 extending from the first and second output circuits 2c and 2d in the data input buffer 2 are provided on the semiconductor chip over a long length and are connected to a sense amplifier associated with each group of memory cells 5. Thus, the data lines 3 and 4 have a large distributed capacitance in the same way as in the prior art. In the present example, where the data lines 3 and 4 are provided over a length of 20 mm, if a distributed capacitance per unit distance of the data lines 3 and 4 is 0.5 pF/mm, the distributed capacitance for a full length of the data lines 3 and 4 amount to 10 pF (=20 mm×0.5 pF/mm).

The sense amplifier 6 in the group of memory cells 5 is a differential amplifier circuit for amplifying electrical potential difference at the ends of the data lines 3 and 4. Namely, the ends of the data lines 3 and 4 are respectively connected to gates of two P-channel MOSFETs and electrical potentials or differential at the drains of these two MOSFETs are complementarily amplified by two N-channel MOSFETs.

The drains of the P-channel MOSFETs are connected to column transfer gates 7 respectively through inverter circuits 6a and 6b so that the write data is output from the sense amplifier 6 to the column transfer gates 7 and the bit lines. Thus, the sense amplifier 6 is capable of complementarily outputting the write data to the column transfer gates 7 in accordance with the electrical potential difference at the ends of the data lines 3 and 4.

The column transfer gates 7 select a pair of complementary bit lines 8 from a number of pairs of bit lines in a memory cell array by the use of a column decoder (not shown). The output of the inverter circuit 6a of the sense amplifier 6 is connected to a bit line B, and the output of the inverter circuit 6b of the sense amplifier 6 is connected to a bit line $\overline{B}$. Thus, complementary output data from the sense amplifier 6 is respectively transmitted to the bit lines B and $\overline{B}$ of the selected pair of bit lines 8. A number of memory cells typically are connected to each pair of bit lines 8. After the levels of complementary write signal on each of the pair of bit lines 8 is determined by the sense amplifier 6, the input data is written and stored in a desired memory cell 9 selected by a row decoder (not shown).

Figure 2:
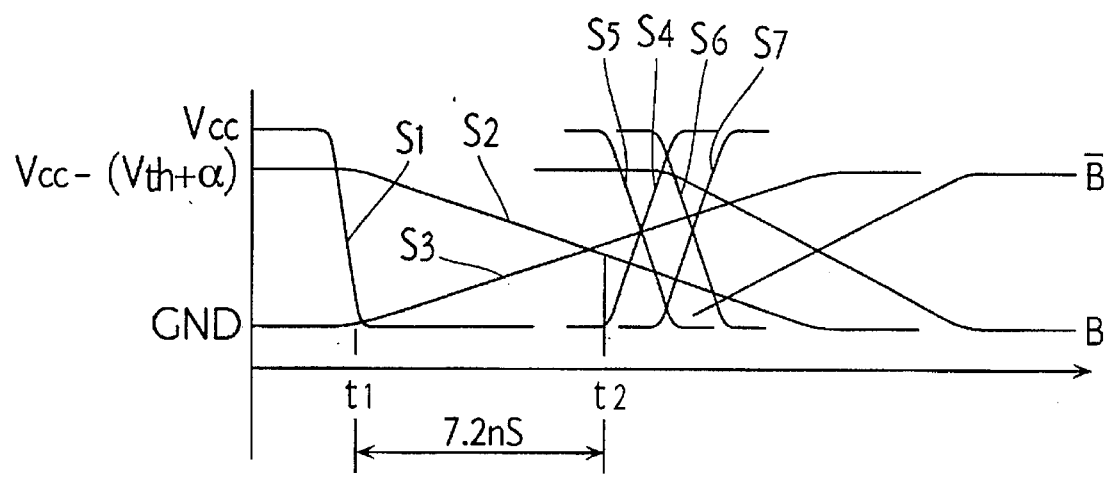
FIG. 2 is a timing chart showing the operation of the data write section shown in FIG. 1.

The operation of the data write section of the semiconductor memory device with the above-mentioned structure will next be described with reference to FIG. 2.

When the level of input data $S_1$ at the data input pad 1 is switched from an H level to an L level at t1, the output level of the first inverter circuit 2a of the data input buffer 2 is changed to an H level, and the output level of the second inverter circuit 2b is changed to an L level. As a result, the MOSFET connected to the power source $V_{cc}$ in the first output circuit 2c is turned off and the MOSFET connected to the ground GND therein is turned on. As the data line 3 starts being discharged, an electrical potential $S_2$ at the end of the data line 3 begins to gradually decrease. In this case, the MOSFET connected to the power source $V_{cc}$ in the second output circuit 2d is turned on and the MOSFET connected to the ground GND therein is turned off. As a result, the data line 4 starts being charged and an electrical potential $S_3$ at the end of the data line 4 begins to gradually increase. The H level produced by the output circuit 2c or 2d is lower than the $V_{cc}$ by the sum of a threshold voltage $V_{th}$ and a voltage $\alpha$ due to back bias effects, so that the electrical potentials $S_2$ and $S_3$ vary between the GND level and the voltage $V_{cc}-(V_{th}+\alpha)$.

As described above, the electrical potentials $S_2$ and $S_3$ of the data lines 3 and 4 decrease and increase, respectively. At time t2, the electrical potential $S_3$ becomes greater than the electrical potential $S_2$. When the difference between the electrical potentials $S_2$ and $S_3$ becomes equal to or greater than the threshold voltage $V_{th}$ of the P-channel MOSFETs, differential amplified outputs $S_4$ and $S_5$ from the drains of the P-channel MOSFETs are respectively inverted. Consequently, an output $S_6$ of the inverter circuit 6a is switched to an L level, and an output $S_7$ of the inverter circuit 6b is switched to an H level. The bit lines B and $\overline{B}$ of the pair of bit lines 8 selected by the column transfer pates 7 thus start being discharged and charged, respectively. Here, the column transfer pates 7 also use N-channel MOSFETs, so that the electrical potentials at the bit lines B and $\overline{B}$ vary between the GND level and the $V_{cc}-(V_{th}+\alpha)$. After the electrical potentials at the bit lines B and $\overline{B}$ are determined, the write data is stored in the desired memory cell 9 selected by the row decoder (not shown).

Figure 5:
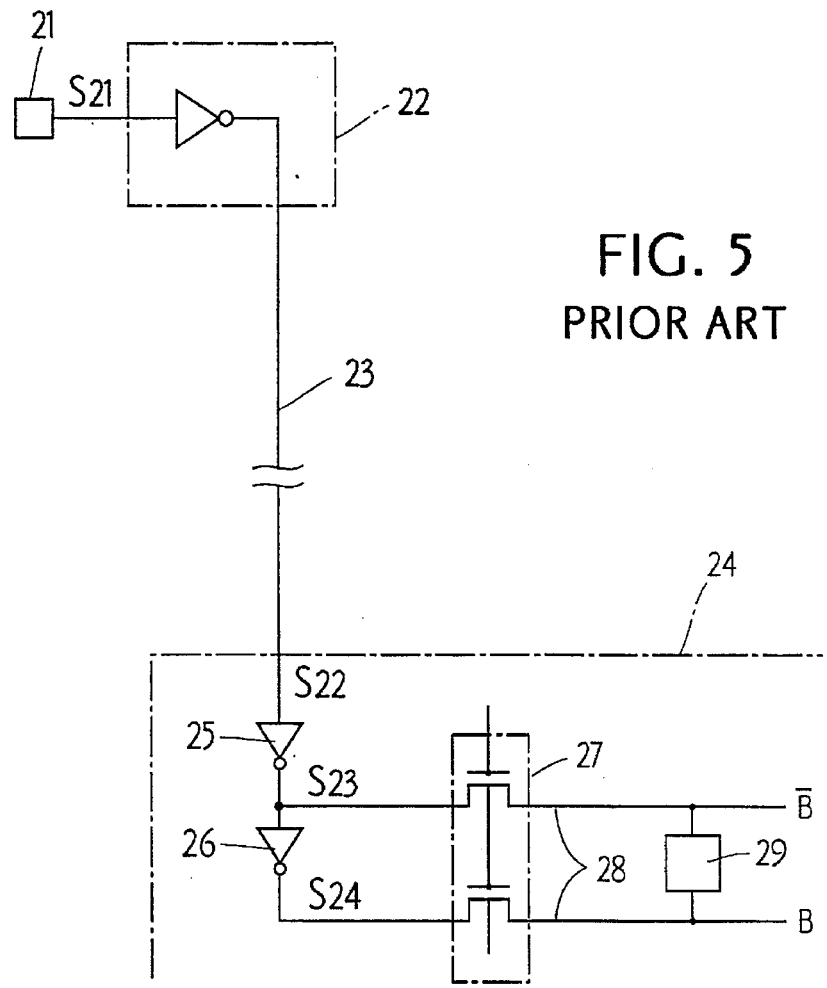
FIG. 5 is a block diagram of a data write section of a conventional example of a data write section in a semiconductor memory device.
Figure 6:
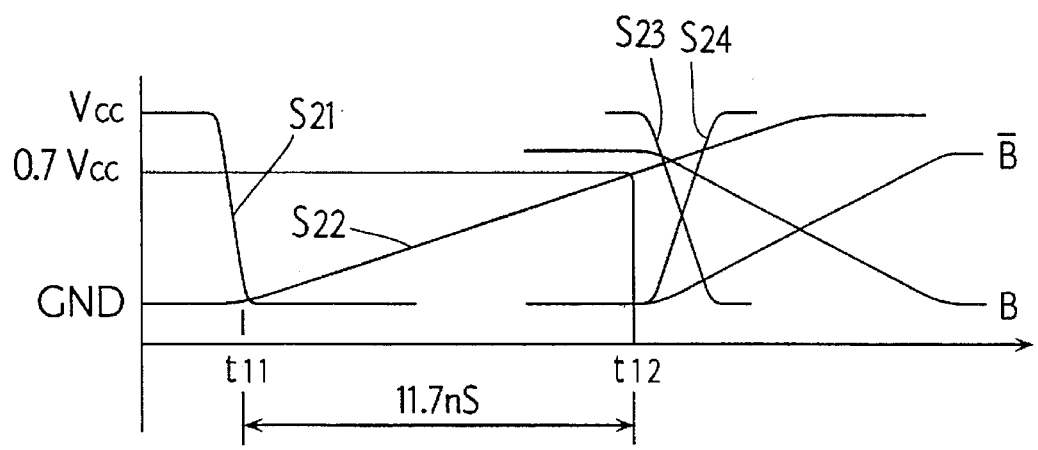
FIG. 6 is a timing chart showing the operation of the data write section in FIG. 5.

The signal transition time on the data lines 3 and 4 in the present example is next calculated based on the following examplary parameters. The distributed capacitance of the data lines 3 and 4 reaches 10 pF with the above-mentioned full length of 20 mm. Moreover, the power source $V_{cc}$ is taken as 5 V, and the driving capacity of the MOSFETs of the output circuits 2c and 2d are taken as 3 mA. Thus, these assumed conditions are the same as those assumed in the conventional example shown in FIG. 5.

Initially, for simplicity, the case where the electrical potentials of the data lines 3 and 4 fully swing between GND level and $V_{cc}$ level will be considered. Charging and discharging time until the electrical potential $S_3$ becomes greater than the electrical potential $S_2$ and the difference therebetween becomes the threshold voltage $V_{th}$ (0.8 V) or more, is obtained by the following equation:

$$t = \frac{C\left(\frac{V_{cc}}{2} + \frac{V_{th}}{2}\right)}{I} \quad \text{(VI)}$$

$$= \frac{10 \times 10^{-12} \times (2.5 + 0.4)}{3 \times 10^{-3}} \approx 9.7 \text{ nS}$$

This equation is obtained from Equation IV. According to the above equation, the charging and discharging time becomes about 9.7 nano sec. Thus, in the present example, even though the electrical potentials at the data lines 3 and 4 fully swing between the GND level and the $V_{cc}$ level, the signal transition time on the data lines 3 and 4 is reduced by about 17%, compared with the conventional example.

Next, the case where the electrical potentials of the data lines 3 and 4 vary between GND level and $V_{cc}-(V_{th}+\alpha)$ will be described. Assuming a voltage $\alpha$ (changed amount due to back bias effects) of 0.7 V, the voltage V in Equation IV becomes 2.15 V as shown by the following Equation VII:

$$V = \frac{V_{cc} - (V_{th}+\alpha)}{2} + \frac{V_{th}}{2} \quad \text{(VII)}$$

$$= \frac{5 - (0.8 + 0.7)}{2} + \frac{0.8}{2} = 2.15$$

Therefore, according to the following Equation (VIII):

$$t = \frac{CV}{I} \quad \text{(VIII)}$$

$$= \frac{10 \times 10^{-12} \times 2.15}{3 \times 10^{-3}} \approx 7.2 \text{ nS}$$

the charging and discharging time becomes about 7.2 nano sec. Thus, the real signal transition time in the present example is reduced by about 26%, compared with the case where the electrical potentials of the data lines 3 and 4 fully swing between the GND level and the $V_{cc}$ level. The real signal transition time thus can be reduced by about 40%, compared with the conventional example shown in FIG. 5.

As described above, the decreased amplitude obtained by varying the electrical potentials of the data lines 3 and 4 between GND level and $V_{cc}-(V_{th}+\alpha)$ results in a reduction of the signal transition time as well as a decrease in electric power dissipation during operation. Namely, the current of a CMOS circuit during operation is determined by a charge and discharge current of a load capacitance C in a circuit wherein there is no DC path. Suppose that a working frequency is f, then a charge and discharge current I can be represented by Equation IX:

$$I = fCV^2 \quad \text{(IX)}$$

Thus, the charge and discharge current I is in proportion to the square of the voltage V, so that when the electrical potentials of the data lines 3 and 4 are decreased from the $V_{cc}$ level to the $V_{cc}-(V_{th}+\alpha)$ level, the charge and discharge current I can be reduced by up to 49% according to the following Equation X:

$$\frac{\{V_{cc}-(V_{th}+\alpha)\}^2}{V_{cc}^2} = \frac{\{5-(0.8+0.7)\}^2}{5^2} = 0.49 \quad \text{(X)}$$

As a result, the consumption electric power dissipated can be reduced by almost half.

According to the present example, if the electrical potentials of the data lines 3 and 4 are varied by almost half between the GND level and $V_{cc}-(V_{th}+\alpha)$, and the levels of the electrical potentials are reversed, then the output of the sense amplifier 6 to the pair of bits 8 can be determined. Thus, the signal transition time on the data lines 3 and 4 can greatly be reduced.

EXAMPLE 2

Figure 3:
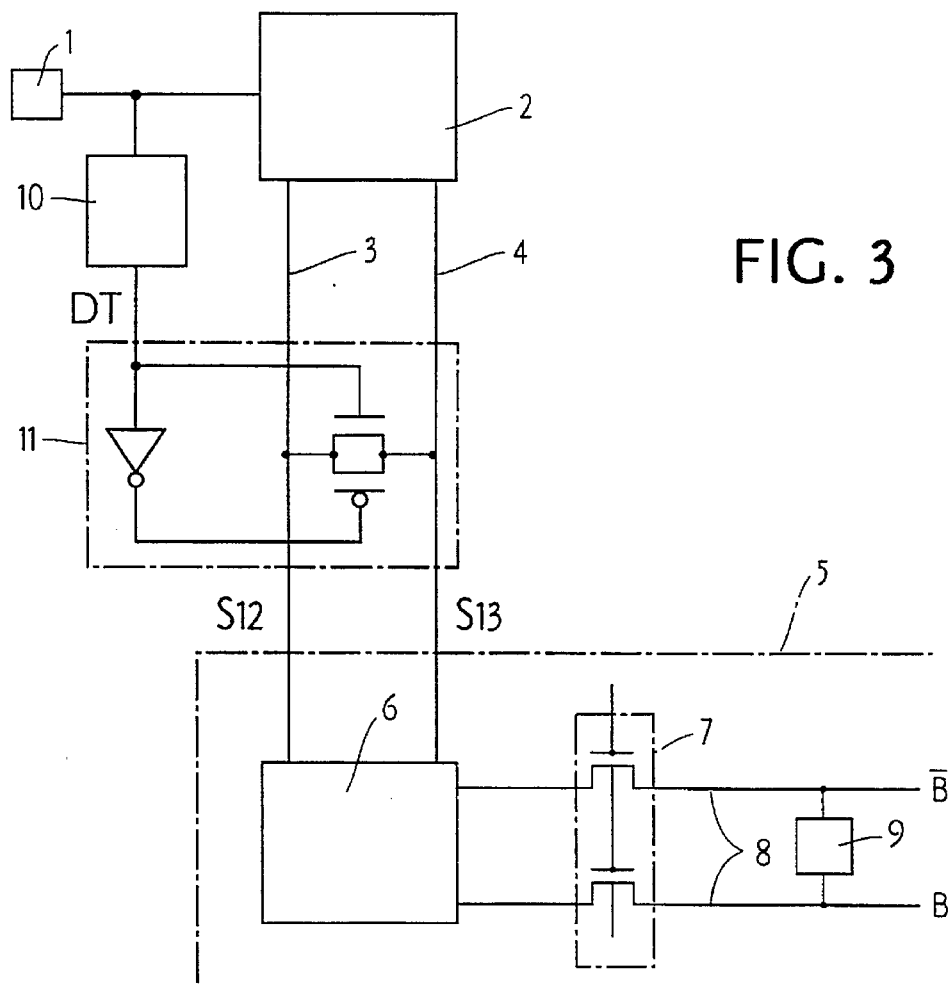
FIG. 3 is a simplified schematic diagram of another example of a data write section in a semiconductor memory device according to the present invention.

With reference to FIG. 3, the same reference numerals as those in FIG. 1 are used for components having the same functions as those in FIG. 1. Therefore, the descriptions thereof is not repeated.

In the data write Section of the present example, an input transition detection circuit 10 for receiving a signal level of the data input pad 1 and a switching circuit 11 for short-circuiting the data lines 3 and 4 by a pair of CMOSFETs are provided. The input transition detection circuit 10 outputs a detection signal DT to the switching circuit 11 for a predetermined period of time, in each case when the signal level of the data input pad 1 is changed. Moreover, when the switching circuit 11 receives the detection signal DT from the input transition detection circuit 10, the switching circuit 11 turns on the CMOSFETs and short-circuits or connects the data lines 3 and 4 together.

Figure 4:
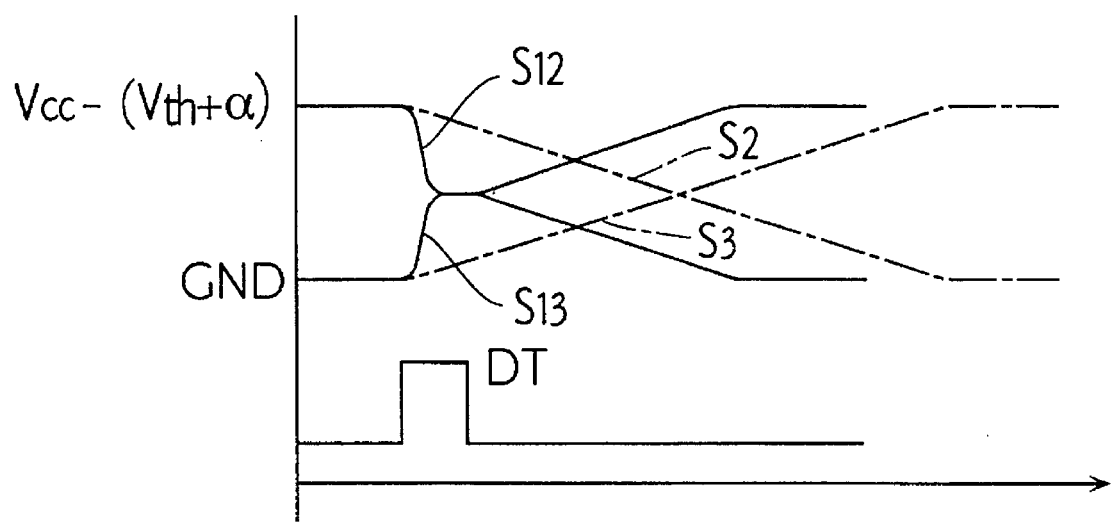
FIG. 4 is a timing chart showing the operation of the data write section shown in FIG. 3.

Thus, according to the present example, as shown in FIG. 4, when the signal level of the data input pad 1 is changed and the detection signal DT from the input transition detection circuit 10 is output for a predetermined period of time, the switching circuit 11 short-circuits the data lines 3 and 4. During this time, the switching circuit 11 causes the data lines 3 and 4 to charge and discharge with respect to each other until electrical potentials $S_{12}$ and $S_{13}$ rapidly become the same level or substantially equalized. After that, when the output of the data input buffer 2 is switched in accordance with a change of the input data signal level at the data input pad 1, the data lines 3 and 4, which first reach the same potential during time for the detection signal DT, are respectively charged and discharged after time for the detection signal DT, thereby increasing and decreasing the electrical potentials $S_{12}$ and $S_{13}$, respectively. As a result, the sense amplifier 6 determines the signal level of the data lines 3 and 4 and outputs the appropriate signals to the pair of bit lines 8 within a short period of time after the output of the detection signal According to the present example, before the data input buffer 2 starts charging and discharging the data lines 3 and 4, these data lines 3 and 4 are short-circuited together so that the respective electrical potentials are approximated or equalized. Thus, the signal transition time on the data lines 3 and 4 can be further shortened.

As is apparent from the above description, according to the semiconductor memory device of the present invention, the sense amplifier can determine the signal level merely by reversing the electrical potentials at the ends of the data lines. Therefore, the signal transition time on the data lines can be shortened to improve an access speed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:

a memory cells section;

an input portion for receiving input data to be stored in said memory cells section;

a buffer means connected to said input portion and having a first output and a second output, said buffer means, in response to the input data, producing high level electrical potential at one of the first output and said second output and complementarily producing low level electrical potential at the other of said second output or said first output;

said memory cells section including a sense amplifier having a first input and a second input for receiving, respectively, an input electrical potential from said first output of said buffer means and an input electrical potential from said second output of said buffer means, said sense amplifier comparing said two input electrical potentials; said sense amplifier further having a first output and a second output which are respectively connected to corresponding bit line pairs connected to said memory cells section; said sense amplifier, in response to the result of comparison of said two input electrical potentials, producing high level electrical potential at one of said first output and said second output of said sense amplifier and complementarily producing a low level electrical potential at the other of said second output and said first output of said sense amplifier in order to store said input data in said memory cells section;

a first line for connecting said first output of said buffer means to said first input of said sense amplifier; and a second line for connecting said second output of said buffer means to said second input of said sense amplifier, wherein said device farther comprising: detection means for detecting a transitional change in level of said input data and producing a detection signal at an output of said detection means in response to said transitional change in level of said input data; and switch means connected to said detection means for electrically connecting said first line to said second line for a short period in response to said detection signal, thereby pre-charging said first and second lines to be at substantially the same electrical potential level.

2. A semiconductor memory device comprising:

a memory cell array with each cell being connected to respective pairs of complementary bit lines;

said memory cell array including write means for writing input data to said memory cells by applying complementary write signals to said complementary bit lines; and means for equalizing said data lines prior to a write operation, said write means comprising complementary data lines, buffer means for applying complementary data signals to said date lines in response to said input data, and amplifier means connected to said data lines and said bit lines for amplifying complementary data signals on said data lines to produce said complementary write signals, wherein said equalizing means comprises a parallel transistor pair connected between said data lines, said parallel transistor pair connecting said data lines in response to a control signal active prior to a write operation, and wherein said control signal pulses active in response to an input data transition and returns to inactive prior to a write operation.

3. The memory device of claim 2 wherein said amplifier means comprises a sense amplifier.

4. The memory device of claim 3 wherein said sense amplifier comprises a first pair of transistors each having an output and each having a gate connected to a respective one of said data lines, and a second pair of transistors with each second transistor having an output connected to a respective bit line, each transistor of said second transistor pair being in a cross-coupled configuration such that a gate is connected to one output of said first transistor pair and a corresponding drain is connected to the other output of said first transistor pair.

5. The memory device of claim 4 wherein each gate of said second transistor pair is connected to an output of one of said first pair of transistors associated with a data line that is complementary to said second transistor associated bit line.

6. The memory device according to claim 2 wherein said buffer means comprises a pair of buffer circuits, each of said buffer circuits having an output respectively connected to one of said data lines; each of said buffers having an input connected to input data signals and another input connected to complementary input data signals.

7. The memory device according to claim 6 wherein each of said buffer means comprises a pair of MOSFETS connected in series between a supply voltage and a reference whereby each of said buffer means produces a logic high signal that is at least a threshold voltage less than said supply voltage.

8. The memory device according to claim 2 wherein when said buffer means applies a logic high signal to said data lines, said logic high signal has a voltage level that is less than a supply voltage for the device.

9. The memory device according to claim 8 wherein said buffer means logic high voltage level is approximately $V_{cc}-V_{th}-\alpha$.

10. The memory device of claim 2 wherein said equalizing means causes a substantially equal voltage potential to precharge said data lines, said voltage potential being approximately one-half the supply voltage.

11. The memory device of claim 2 wherein said equalizing means is active only prior to write operations that follow input data transitions.

* * * * *